United States Patent [19]

Kondo et al.

[11] Patent Number: 5,011,734

[45] Date of Patent: Apr. 30, 1991

[54] CERAMIC SUBSTRATE

[75] Inventors: Kazuo Kondo; Asao Morikawa, both of Aichi, Japan

[73] Assignee: NGK Spark Plug Co., Ltd., Aichi, Japan

[21] Appl. No.: 290,941

[22] Filed: Dec. 28, 1988

[30] Foreign Application Priority Data

Dec. 28, 1987 [JP] Japan ............................... 62-201397

[51] Int. Cl.5 ............................................ B32B 15/04

[52] U.S. Cl. ..................................... 428/336; 428/457

[58] Field of Search ....................... 428/901, 336, 457; 501/9; 174/68.5; 430/313

[56] References Cited

U.S. PATENT DOCUMENTS

| | | | |
|---|---|---|---|
| 4,540,621 | 9/1985 | Eggerding et al. | 428/209 |
| 4,540,671 | 9/1985 | Kondo et al. | 501/9 |
| 4,546,065 | 10/1985 | Amendola et al. | 430/313 |
| 4,599,277 | 7/1986 | Brownlow et al. | 428/689 X |
| 4,672,152 | 6/1987 | Shinohara et al. | 174/68.5 |
| 4,712,161 | 12/1987 | Pryor et al. | 428/209 X |

*Primary Examiner*—Thomas J. Herbert

*Attorney, Agent, or Firm*—Sughrue, Mion, Zinn, Macpeak & Seas

[57] ABSTRACT

A ceramic substrate is described, which comprises a fired ceramic sheet that has on its surface a metallized layer made of Au or Cu, or Au-Pt, Au-Pd, Cu-Pt or Cu-Pd alloy that is overlaid with a Ni plating layer.

5 Claims, 1 Drawing Sheet

20

80

45

40

30

10

50

70

CERAMIC SUBSTRATE

BACKGROUND OF THE INVENTION

The present invention relates to a ceramic substrate with a metallized layer that is typically useful as a substrate for IC (integrated circuit) packages.

Substrates for IC packages, multiple chip mounting substrates, substrates for pressure sensors, etc., are conventionally made of ceramics. The surface of ceramic substrates intended for use in such applications is provided with a metallized layer which assists in the soldering of seal plates or outer lead pins.

With a view to saving energy and simplifying the manufacturing process, it has become a common practice in the production of ceramic substrates to coat a green sheet (a substrate to be fired) with a metallizing ingredient and then form a metallized layer simultaneously with the firing of the green sheet. In this practice of forming a metallized layer simultaneously with the firing of a green sheet, if a ceramic material that can be fired at low temperatures of from 800 to 1,100° C. is used, Au or Cu, or Au-Pt, Au-Pd, Cu-Pt or Cu-Pd alloy that have melting points close to the firing temperature can be used as metallizing components. In particular, Au and Cu have appreciably low resistance to conduction as compared with W, Mo and other metals that are conventionally used in alumina-base ceramics, as ingredients of the metallized layer of a type that is formed simultaneously with the firing of the green sheet. The use of Au and Cu offers advantages such as faster transmission of electrical signals and lower power loss.

However, if common solder, which is made of a tin-lead base alloy, is applied to the metallized layer formed of Au or Cu, or Au-Pt, Au-Pd, Cu-Pt or Cu-Pd alloy, the lead or tin component of the solder will get into the metallized layer, which can result in formation of an alloy that has low strength of adhesion to the metallizing component.

SUMMARY OF THE INVENTION

An object, therefore, of the present invention is to provide a ceramic substrate that permits the use of tin-lead base solder without experiencing any deterioration in factors such as adhesion strength.

This object of the present invention can be attained by a ceramic substrate which comprises a fired ceramic sheet that has on its surface a metallized layer made of Au or Cu, or Au-Pt, Au-Pd, Cu-Pt or Cu-Pd alloy that is overlaid with a Ni plating layer.

DETAILED DESCRIPTION OF THE INVENTION

Figure 1:
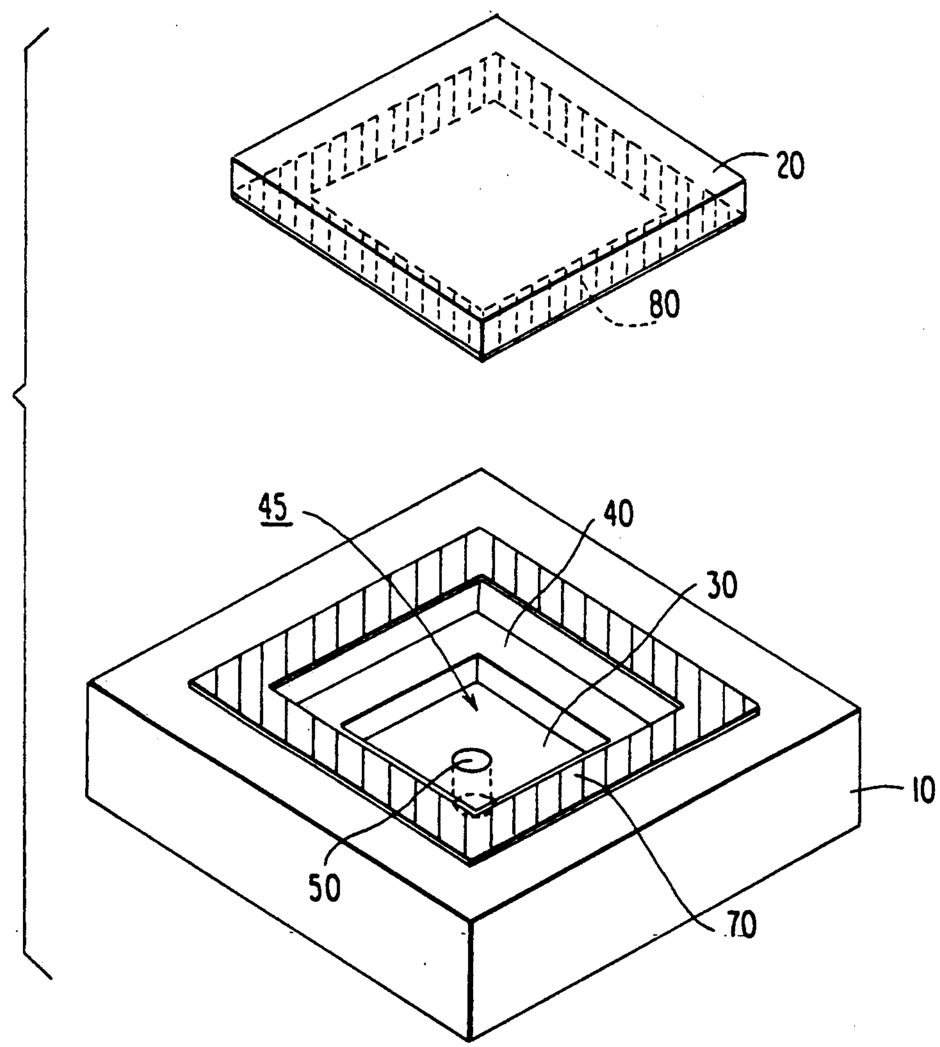
FIG. 1 is a perspective view showing a ceramic substrate according to one embodiment of the present invention, with its base and cap portions being shown separately.

The ceramic substrate of the present invention comprises a fired ceramic sheet that has on its surface a metallized layer made of Au or Cu, or Au-Pt, Au-Pd, Cu-Pt or Cu-Pd alloy that is overlaid with a Ni plating layer.

Preferably, the metallized layer is formed simultaneously with the firing of the ceramic sheet since this contributes to energy saving and simplification of the manufacturing process.

If the metallized layer is formed simultaneously with the firing of the ceramic sheet, the latter is preferably made of a low-firing point ceramic material that can be fired at from 800 to 1,100° C., because the use of such low temperatures prevents oxidation or other deterioration of the metallized layer. Materials that meet this requirement are exemplified by the following: i) a crystallized glass ceramic of the type described in JP-A-59-92943 (the term "JP-A" as used herein means an "unexamined published Japanese patent application"), which is prepared by providing a crystallizable glass material that contains as main ingredients from 57 to 63 wt% $SiO_2$, from 20 to 28 wt % $Al_2O_3$, from 10 to 18 wt % MgO, and from 2 to 6 wt % ZnO, and which further contains from 0.1 to 6 wt % $B_2O_3$ and/or $P_2O_5$, melting the glass material to form a frit, grinding the frit, shaping the ground frit, and firing the shaped article to crystallize the glass material; ii) a glass-ceramic composite of the type described in JP-A-59-645445 which has from 5 to 60 vol % of $SiO_2$-coated ceramic particles dispersed in glass or crystallizable glass having a thermal expansion coefficient of from $5\times10^{-7}$ to $45\times10^{-7}$; iii) a crystallized glass ceramic of the type described in JP-A-59-83957, which is prepared by providing a crystallizable glass material that is composed of from 40 to 52 wt % $SiO_2$, from 27 to 37 wt % $Al_2O_3$, from 10 to 20 wt % MgO, from 2 to 8 wt % $B_2O_3$, from 2 to 8 wt % CaO, and from 0.1 to 3 wt % $ZrO_2$; melting the glass material to form a frit; grinding the frit; shaping the ground frit; and firing the shaped article to crystallize the glass material; and iv) a crystallized glass ceramic of the type described in JP-A-59-137341, which is prepared by providing a crystallizable glass material that contains as main ingredients from 55 to 63 wt % $SiO_2$, from 20 to 28 wt % $Al_2O_3$, from 1 to 8 wt % $Y_2O_3$, and from 10 to 20 wt % MgO and which further contains from 0.1 to 5 wt % $BzO_3$ and/or $P_2O_5$, melting the glass material to form a frit, grinding the frit, shaping the ground frit, and firing the shaped article to crystallize the glass material.

The metallized layer is preferably made of Au, Au-Pt alloy, or Au-Pd alloy; alternatively, it is preferably made of Cu, Cu-Pt alloy, or Cu-Pd alloy.

The Ni plating layer on the metallized layer may be formed by electroless plating, electroplating, sputtering, or any other methods that are known in the art. This Ni plating layer preferably has a thickness of 2 to 4 μm, and it more preferably has a thickness of 2 to 3 μm. If the Ni plating layer is thinner than 2 μm, it will not exhibit the desired coating effect. If the Ni plating layer is thicker than 4 μm, it might expand or separate from the metallized layer during use.

The ceramic substrate of the present invention is characterized by the Ni plating layer formed on the metallized layer on the surface of a ceramic sheet. When tin-lead base solder is applied to the ceramic substrate, the Ni plating layer prevents the lead or tin component of the solder from getting into the metallized layer, thereby resisting deterioration in its adhesion strength.

An embodiment of the present invention is described hereinafter with reference to FIG. 1 which depicts a substrate for an IC package with its base and cap shown separately. The substrate shown in FIG. 1 is composed of a base 10 and a cap 20, which are formed of the crystallized glass ceramic described in JP-A-59-92943. The base 10 has a bottom 30 to which an IC chip (not shown) is to be fixed, a step portion 40 on which a wiring pattern (not shown) to be connected to the IC chip with leads (not shown) is to be formed, and an opening 45. The center of the bottom 30 is provided with an air vent hole 50 through which the interior of the substrate is evacuated for checking its airtightness after the base is sealed with the cap. A metallized layer 70 made of Au or Cu, or Au-Pt, Au-Pd, Cu-Pt or Cu-Pd alloy is formed on the surface of the base 10 around the opening 45 simultaneously with the firing of the base. This metallized layer 70 is provided with Ni plating.

The cap 20 is also provided with a metallized layer 80 in the area which is to be bonded to the base 10, and this metallized layer 80 is made of the same material as that of the metallized layer 70 on the base 10. This metallized layer 80 is also provided with Ni plating.

The metallized layer 70 on the base 10 is soldered to the metallized layer 80 on the cap 20 so as to form a substrate for IC package in unitary assembly.

The base 10 and the cap 20 are produced by the following procedures:

(1) forming a green sheet of a predetermined thickness from the formulation shown in JP-A-59-92943 (corresponding to U.S. Pat. No. 4,540,671);

(2) punching out holes in the green sheet that have predetermined shapes corresponding to the opening 45 and air vent hole 50;

(3) coating a paste of Au or Cu, or Au-Pt, Au-Pd, Cu-Pt or Cu-Pd alloy on the green sheet by a thick-film process (the paste of Cu, or Cu-Pt or Cu-Pd alloy also contains CuO);

(4) cutting the green sheet, which may be a laminate as required, into shapes that correspond to the base 10 and the cap 20;

(5) calcining the segments of green sheet to remove the resin components;

(6) firing the segments of green sheet (they are fired in air atmosphere at a predetermined temperature if the metallized layer is made of Au, and if the metallized layer is made of Cu, the segments are first calcined in air atmosphere, reductively fired in $H_2$ gas or a mixture of $H_2$ gas and $N_2$ gas, and then fired at the final temperature in $N_2$ gas); and (7) forming a Ni plating layer of a thickness of 2 to 3 μm on the metallized layer on the fired segments by electroplating or electroless plating.

The base 10 and cap 20 prepared by the process described above were bonded with solder consisting of 60 wt % Sn and 40 wt % Pb, to fabricate two samples of a substrate for IC packages. Comparative samples were fabricated without forming a Ni plating layer on the metallized layer. The following experiment was conducted to investigate the effectiveness of the Ni plating layer, and the results are shown in Table 1.

Each of the sample substrates for IC package was aged by heating at 120° C. for various time lengths, and any leakage that might occur in the sealed portion where the base was bonded to the cap with solder was measured with a He leak detector. For this purpose, He gas was blown against the sample from the outside with the detector being attached to the bottom of the base 10 so as to evacuate its interior through the air vent hole 50. The amount of He gas that would enter the sample through the joint between the base 10 and the cap 20 was measured with the detector. Samples with which the ingress of He gas was observed were rated "unacceptable".

The adhesion strength of the metallized layer on each sample was measured by the following method and the results are also shown in Table 1.

Adhesion Test

A metallized layer (1.6 mm×1.6 mm) made of the same material as that employed in the samples described above was formed on a test piece that was made of the same material as that of the samples; a copper wire was bonded to the metallized layer with solder (60 wt % Sn+40 wt % Pb); the copper wire was pulled up in a vertical direction and the load necessary to cause separation between the copper wire and the metallized layer was measured with a tension gage. Measurements were conducted on several test pieces of the same sample and the average value is shown in Table 1. Samples in which the copper wire readily separated from the metallized layer when they were touched with a hand were marked with "poor" in Table 1.

TABLE 1

| Material of metallized layer | Ni plate | Leakage and adhesion strength | Aging at 120° C. (h) 0 | 50 | 100 | 150 | 250 | 400 |
|---|---|---|---|---|---|---|---|---|
| Au | absent | leakage | 0/10 | 1/10 | 10/10 | — | — | — |
| | | adhesion strength | 1.24 | poor | — | — | — | — |
| | present | leakage | 0/10 | 0/10 | 0/10 | 0/10 | 0/10 | 0/10 |
| | | adhesion strength | 1.33 | 1.11 | 1.04 | 1.06 | 0.53 | 0.36 |
| Cu | absent | leakage | 0/10 | 0/10 | 1/10 | 3/10 | 5/10 | 8/10 |
| | | adhesion strength | 2.38 | 0.79 | poor | — | — | — |
| | present | leakage | 0/10 | 0/10 | 0/10 | 0/10 | 0/10 | 0/10 |
| | | adhesion strength | 2.48 | 2.40 | 2.31 | 2.38 | 1.80 | 1.25 |

* The values for leakage are expressed in "the number of unacceptable samples/the total number of samples tested". The adhesion strength is expressed in kilograms.

As Table 1 shows, whether the metallized layers 70 and 80 were made of Au or Cu, the Ni plating layer formed on them proved to be effective in preventing deterioration in their airtightness and adhesion strength. Similar results were confirmed with Au-Pt, Au-Pd, Cu-Pt and Cu-Pd alloys.

In the embodiment described above, Ni plating is performed only on the metallized layers 70 and 80 which are formed in the area of bonding between the base 10 and the cap 20. If necessary, Ni plating may also be applied to a metallized layer that is formed to provide a conduction path for connection to outer lead pins.

As will be understood from the foregoing description, the ceramic substrate of the present invention has the advantage that because of the presence of a Ni plating layer as an overcoat, the metallized layer formed of Au or Cu, or Au-Pt, Au-Pd, Cu-Pt or Cu-Pd alloy permits the use of tin-lead base solder without allowing the lead or tin component of the solder to get into the metallized layer, which would otherwise cause deterioration in its adhesion strength. Therefore, the ceramic substrate of the present invention is useful as a substrate for IC packages and other devices that should exhibit reliable adhesion strength.

While the invention has been described in detail and with reference to specific embodiments thereof, it will be apparent to one skilled in the art that various changes and modifications can be made therein without departing from the spirit and scope thereof.

What is claimed is:

1. A ceramic substrate which comprises a fired ceramic sheet that has on its surface a metallized layer made of Au or Cu, or Au-Pt, Au-Pd, Cu-Pt or Cu-Pd alloy that is overlaid with a plating layer consisting essentially of Ni.

2. A ceramic substrate according to claim 1 wherein said Ni plating layer has a thickness of 2 to 4 μm.

3. A ceramic substrate according to claim 1 wherein said Ni plating layer has a thickness of 2 to 3 μm.

4. A ceramic substrate according to claim 1 wherein said metallized layer is formed simultaneously with the firing of said ceramic sheet.

5. A ceramic substrate according to claim 4 wherein said ceramic sheet is fired at a temperature of from 800 to 1,100° C.

* * * * *